United States Patent [19]

Sato

[11] Patent Number: 5,708,605
[45] Date of Patent: Jan. 13, 1998

[54] NONVOLATILE SEMICONDUCTOR MEMORY DEVICE HAVING VARIABLE WRITING AND ERASING TIME PERIODS

[75] Inventor: Toshiya Sato, Tokyo, Japan

[73] Assignee: NEC Corporation, Tokyo, Japan

[21] Appl. No.: 719,980

[22] Filed: Sep. 24, 1996

[30] Foreign Application Priority Data

Sep. 27, 1995 [JP] Japan .................. 7-274886

[51] Int. Cl.[6] .................................. G11C 11/34
[52] U.S. Cl. ............... 365/185.29; 365/185.22; 365/185.18
[58] Field of Search ............. 365/185.29, 185.18, 365/185.22, 236

[56] References Cited

U.S. PATENT DOCUMENTS 5,410,511  4/1995  Michiyama ............... 365/185.22 X
5,463,586  10/1995  Chao et al. ................ 365/185.22 X
5,583,809  12/1996  Noguchi et al. .......... 365/185.29 X
5,621,687  4/1997  Doller ......................... 365/185.29

FOREIGN PATENT DOCUMENTS 5-54683  3/1993  Japan .

*Primary Examiner*—David C. Nelms
*Assistant Examiner*—Huan Hoang
*Attorney, Agent, or Firm*—Sughrue, Mion, Zinn, Macpeak & Seas, PLLC

[57] ABSTRACT

In a nonvolatile semiconductor memory device, a nonvolatile counter is provided to store a number of erasing operations. A time period of a writing operation upon a memory cell is changed in accordance with the number of erasing operations. Also, a time period of an erasing operation upon memory cells is changed in accordance with the number of erasing operations.

10 Claims, 11 Drawing Sheets

Fig. 2 PRIOR ART
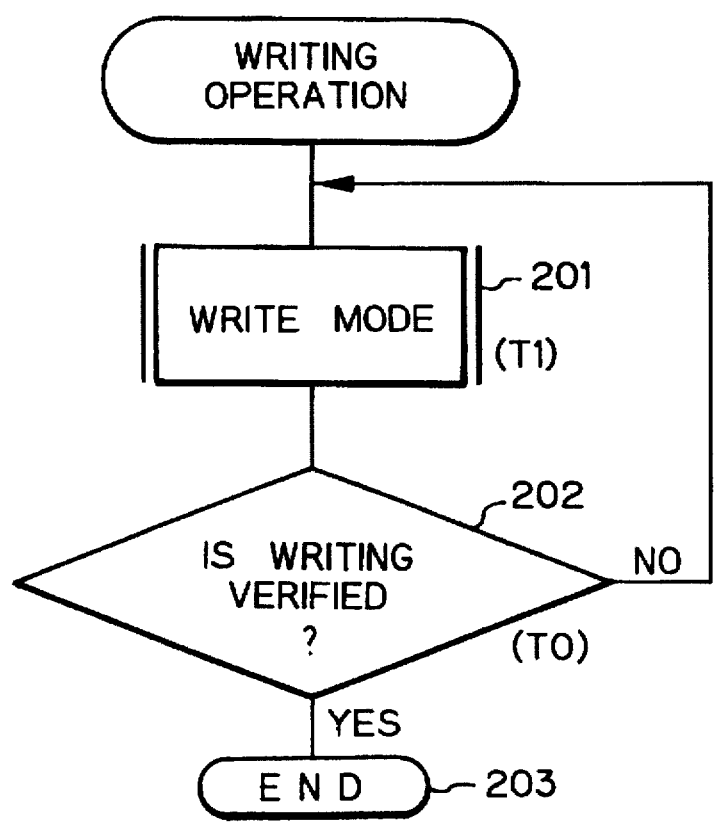
PRIOR ART
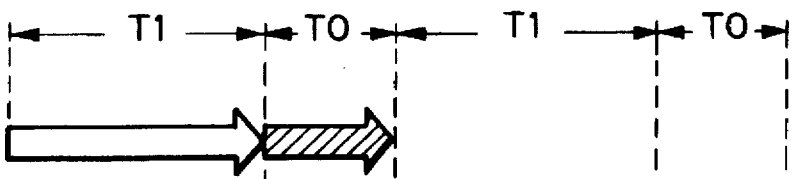
*Fig. 3A*
*Fig. 3B*

Fig. 7
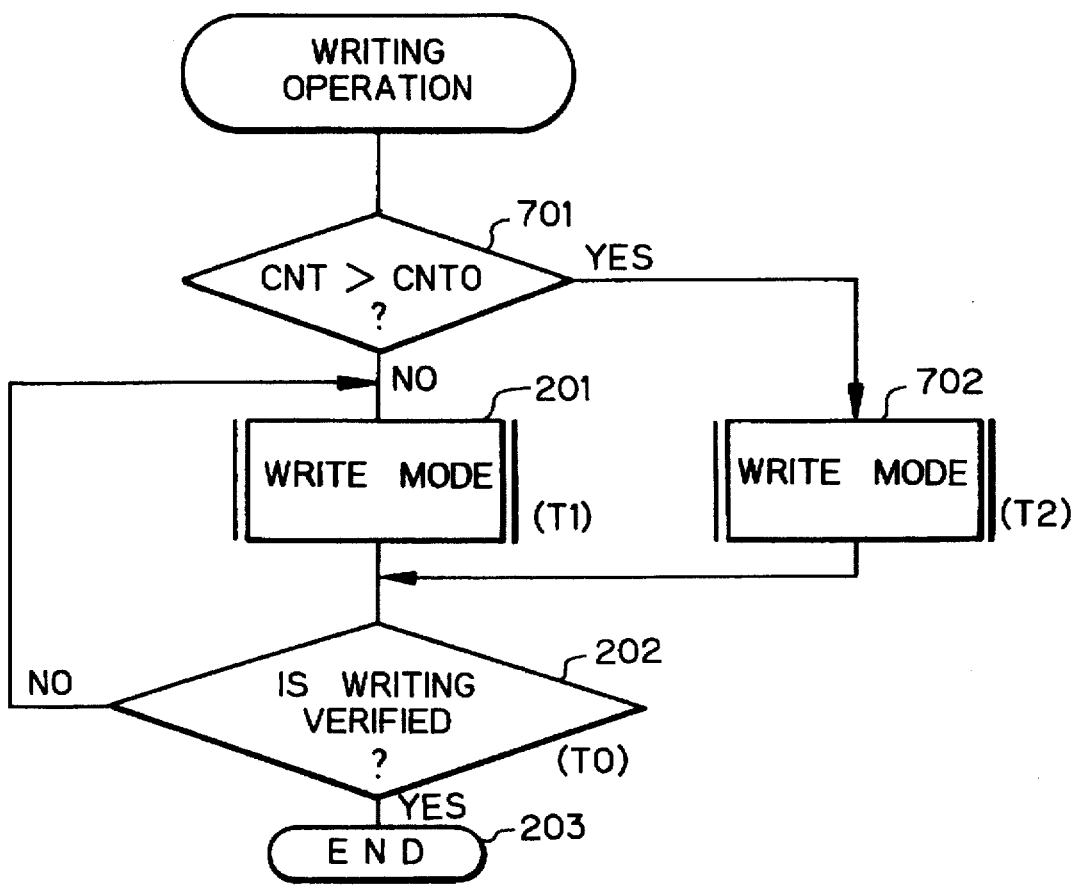
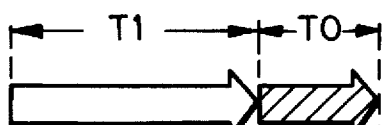
Fig. 8A
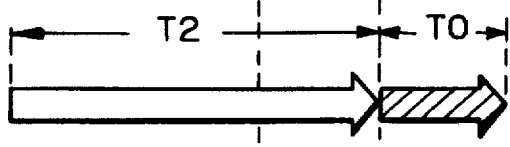
Fig. 8B
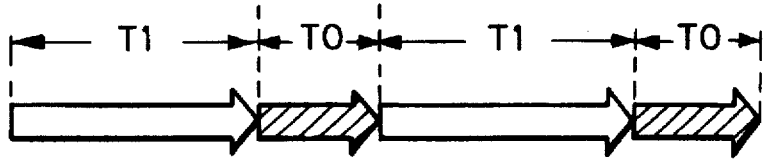
Fig. 8C
PRIOR ART

NONVOLATILE SEMICONDUCTOR MEMORY DEVICE HAVING VARIABLE WRITING AND ERASING TIME PERIODS

BACKGROUND OF THE INVENTION

1. Field of the Invention

The present invention relates to a nonvolatile semiconductor memory device, and more particularly, to the improvement of a writing operation and/or an erasing operation of the nonvolatile semiconductor memory device.

2. Description of the Related Art

In a nonvolatile semiconductor memory device, a writing operation can be carried out after the device is mounted on a printed circuit board. One typical example of such a device is a flash memory which has advantages in that data storage is possible without a backup battery and in that is highly integrated.

In a prior art nonvolatile memory device, a writing operation is performed upon a selected memory cell for a definite time period. Then, a writing verification operation is performed upon the selected memory cell to determine whether or not the threshold voltage of the memory cell is higher than a lower limit value. As a result, if the threshold voltage of the selected memory cell is not higher than the lower limit value, a writing operation is again performed upon the selected memory cell for the above-mentioned time period. This will be explained later in detail.

In the above-described prior art device, if the deterioration of the memory cell exceeds a predetermined value, the writing time is immediately doubled. This may cause an overwriting operation, which further increases the deterioration of the memory cell. Also, the writing time is eventually increased.

SUMMARY OF THE INVENTION

It is an object of the present invention to suppress the deterioration of memory cells in a nonvolatile semiconductor memory device.

Another object is to reduce a writing time period of the nonvolatile semiconductor memory device.

A still further object is to reduce an erasing time period of the nonvolatile semiconductor memory device.

According to the present invention, in a nonvolatile semiconductor memory device, a nonvolatile counter is provided to store a number of erasing operations. A time period of a writing operation upon a memory cell is changed in accordance with the number of erasing operations. Also, a time period of an erasing operation upon memory cells is changed in accordance with the number of erasing operations.

BRIEF DESCRIPTION OF THE DRAWINGS

The present invention will be more clearly understood from the description as set forth below, as compared with the prior art, with reference to the accompanying drawings, wherein:

FIG. 2 is a flowchart showing the operation of the control circuit of FIG. 1;

FIGS. 3A and 3B are timing diagrams showing the operation of the control circuit of FIG. 1;

FIGS. 6, 7, 9, 11 and 13 are flowcharts showing the operation of the control circuit of FIG. 5; and FIGS. 8A, 8B, 8C, 10A, 10B, 10C, 12A, 12B, 12C, 14A, 14B and 14C are timing diagrams showing the operation of the control circuit of FIG. 5.

DESCRIPTION OF THE PREFERRED EMBODIMENT

Before the preferred embodiment is described, a prior art nonvolatile semiconductor memory device will be explained with reference to FIGS. 1, 2, 3 and 4.

Figure 1:
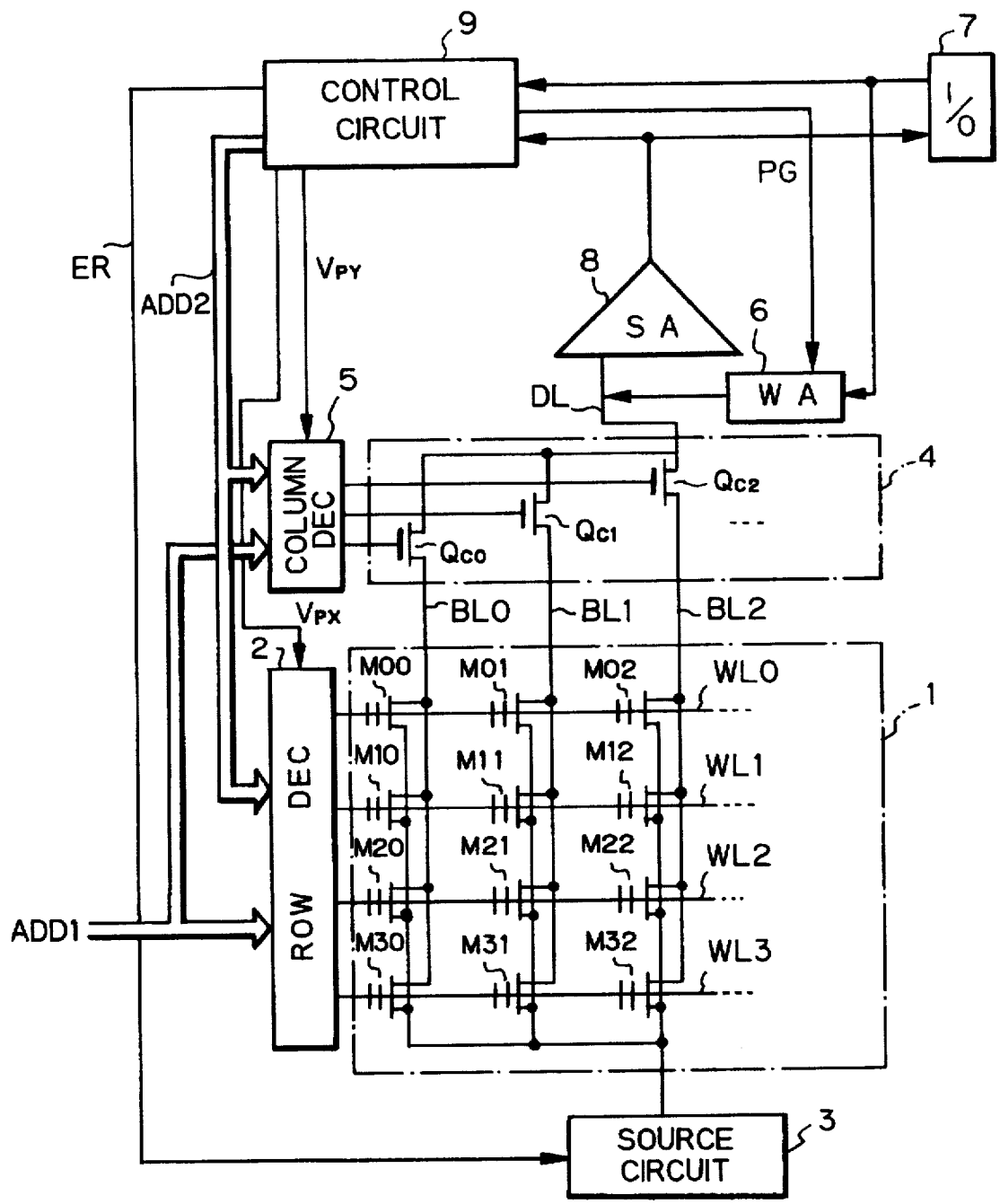
FIG. 1 is a circuit diagram illustrating a prior art nonvolatile semiconductor memory device.

In FIG. 1, which illustrates a prior art nonvolatile semiconductor memory device, a plurality of word lines WL0, WL1, ... and a plurality of bit lines BL0, BL1, ... are provided. Reference numeral 1 designates a memory cell array formed by memory cells M00, M01, ... each of which has a source, a drain connected to one of the bit lines BL0, BL1, ..., a floating gate, and a control gate connected to one of the word lines WL0, WL1, ....

A row decoder 2 selects one of the word lines WL0, WL1, ....

A source circuit 3 is connected to all the sources of the memory cells M00, M01, .... As a result, during an erase mode, the voltages at the sources are caused to be high (=$V_{PP}$). However, during a write/read mode including a writing verification operation and an erase verification operation, the sources are grounded.

A column selection circuit 4 is formed by column selection transistors $Q_{C0}$, $Q_{C1}$, ... each connected between one of the bit lines BL0, BL1, ... and a digit line DL. One of the column selection transistors $Q_{C0}Q_{C1}$, ... is selected and turned ON by a column decoder 5.

A write amplifier 6 receives input data from an input/output buffer 7 and transmits it to the digit line DL. Also, a sense amplifier 8 senses data at the digit line DL and transmits it to the input/output buffer 7. The write amplifier 6 and the sense amplifier 8 are also connected to a control circuit 9. The control circuit 9 receives control signals from the input/output buffer 7 to control the entire device.

The row decoder 2 and the column decoder 5 are controlled by external address signals ADD1 and internal address signals ADD2 from the control circuit 9. Also, the control circuit 9 supplies power supply voltages $V_{PX}$ and $V_{PY}$ to the row decoder 2 and the column decoder 5, respectively. Further, the control circuit 9 generates an erase signal ER for controlling the source circuit 3, and also generates a program signal PG for controlling the write amplifier 8.

A writing operation for one memory cell such as M00 of the device of FIG. 1 is explained next with reference to FIG. 2 which is a routine carried out by the control circuit 9. In this case, it is assumed that the memory cell M00 is selected by the external address signals ADD1.

First, at step 201, the control circuit 9 generates a program signal PG and increases the power supply voltages $V_{PX}$ and $V_{PY}$, for example, 20 to 25V for a time period T1. As a result, the write amplifier 6 is activated by the program signal PG, and accordingly, the high voltage $V_{PP}$ passes through the column selection transistor $Q_{C0}$ to the drain of the memory cell M00. Simultaneously, the high voltage $V_{PP}$ is applied to the control gate of the memory cell M00. In this case, since the erase signal ER is low (=GND), the source circuit 3 is deactivated, so that the source of the memory cell M00 is grounded. Thus, a writing operation is performed upon the memory cell M00 for the time period T1.

Next, at step 202, a writing verification operation is performed upon the memory cell M00 to determine whether or not the threshold voltage of the memory cell M00 is higher than a lower limit value VL which is the same as a power supply voltage $V_{CC}$ or a voltage slightly higher than that. In this case, the control circuit 9 deactivates the program signal PG and the erase signal ER. Also, the increases the power supply voltage $V_{PX}$ to VL, and increases the power supply voltage $V_{PY}$ to $V_{CC}$, for example, 5V. Thus, a reading operation is performed upon the memory cell M00 by using the threshold voltage VL, and it is determined whether or not read data from the sense amplifier 8 is "0", i.e., whether or not the writing operation is complete, thus carrying out a writing verification operation. Only if the read data is "0", does the control proceeds to step 203, thus completing the routine of FIG. 2. Otherwise, the control at step 201 is repeated. Here, it is assumed that such a writing verification operation is carried out for a time period T0.

As shown in FIG. 3A, if the number of writing verification operations is one, a time period of the writing operation upon the memory cell M00 is $$T1+T0 \tag{1}$$

Also, as shown in FIG. 3B, the number of writing verification operations is two, a time of the writing operation upon the memory cell M00 is $$(T1+T0)+(T1=T0)=2\cdot(T1+T0) \tag{2}$$

Figure 4:
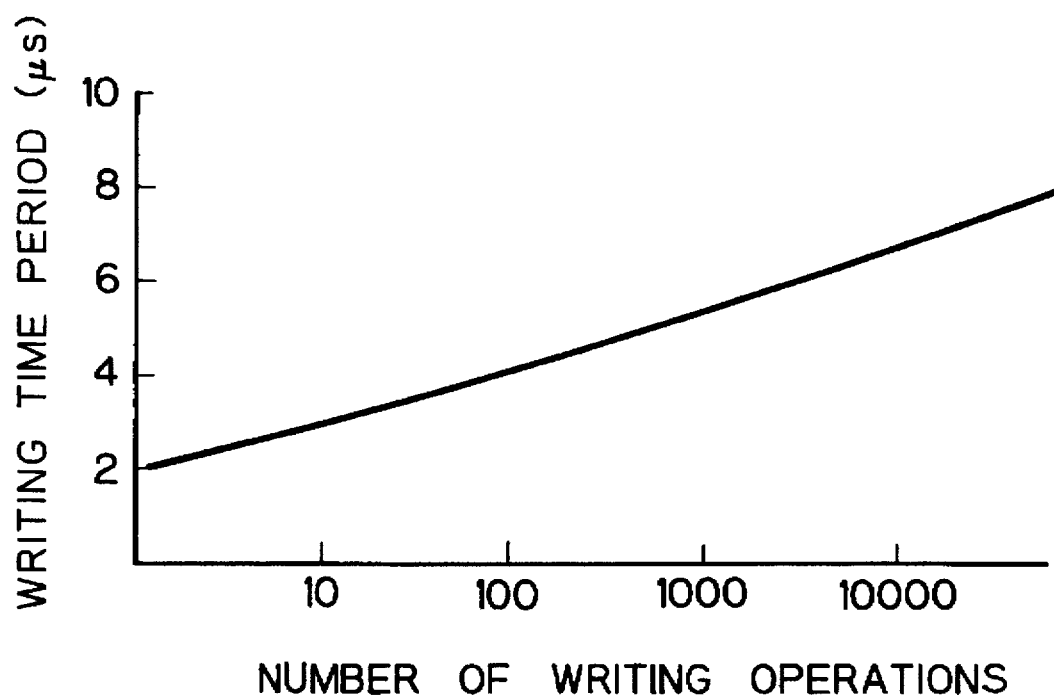
FIG. 4 is a graph showing a relationship between the number of writing operations and the writing time period.

Generally, when the number of writing operations including erasing operations is increased to impose stress to the cell transistors of the memory cells, the cell transistors deteriorate. As a result, as shown in FIG. 4, when the number of writing operations (erasing operations) is increased, a longer writing time period is required. In this case, since the cell transistors of the memory cells gradually deteriorate, the writing time period is gradually increased.

In the device of FIG. 1, using the flowchart as shown in FIG. 2, if the deterioration of the memory cells exceeds a predetermined value, the writing time period is suddenly increased from T1+T0 to 2·(T1+T0). This may cause an overwriting operation, which further increases the deterioration of the memory cells. Also, the writing time period is increased.

Figure 5:
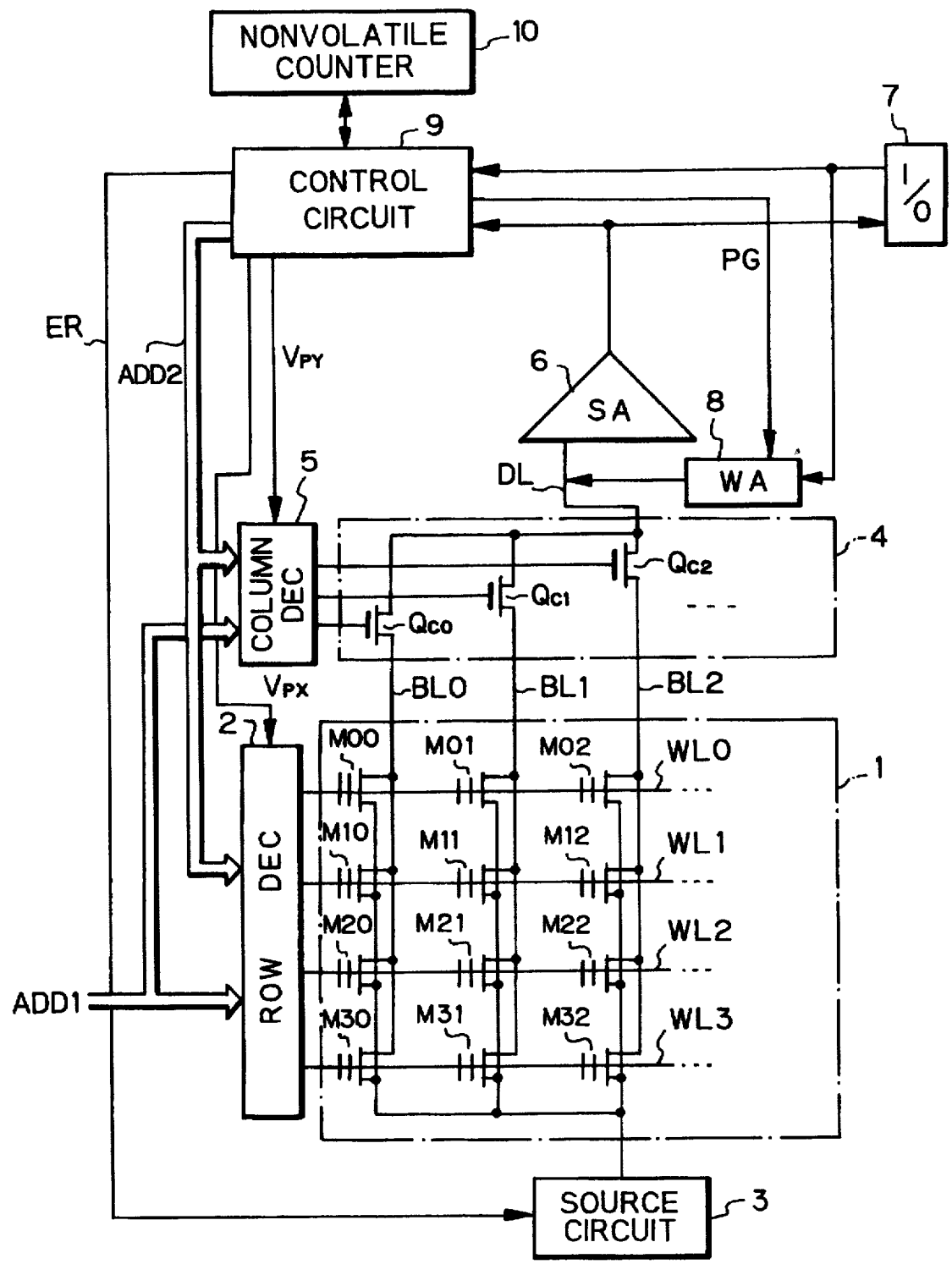
FIG. 5 is a circuit diagram illustrating an embodiment of the nonvolatile semiconductor memory device according to the present invention.

In FIG. 5, which illustrates an embodiment of the present invention, a nonvolatile counter 10 is added to the elements of FIG. 1. The nonvolatile counter 10 counts the number of flash erasing operations which indirectly shows the number of writing operations for an average memory cell.

Figure 6:
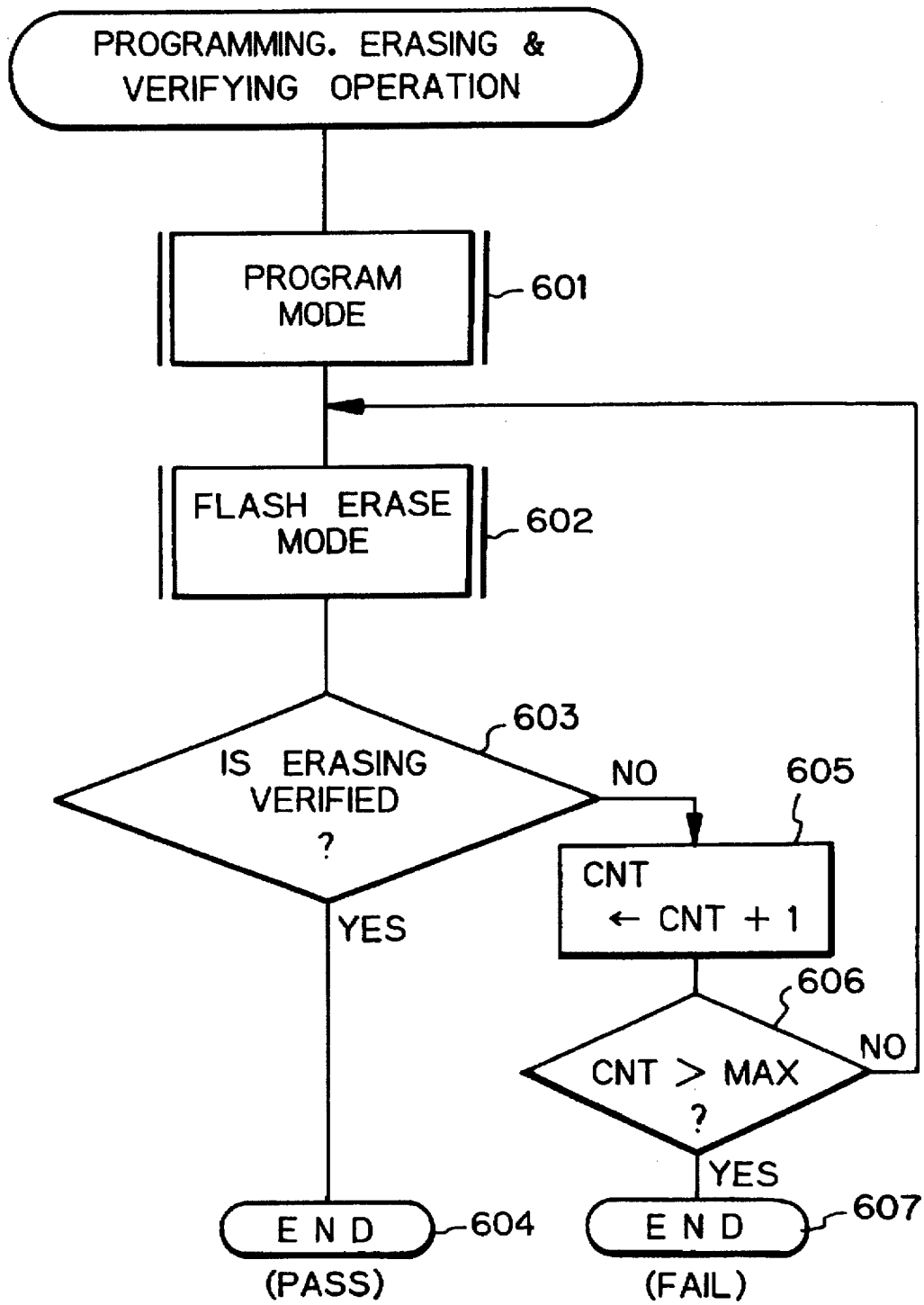

The content CNT of the nonvolatile counter 10 is renewed by a routine as shown in FIG. 6, which is also carried out by the control circuit 9. Note that the content CNT of the nonvolatile counter 10 is cleared before shipping.

First, at step 601, a programming or writing operation for avoiding an over-erasing operation is performed upon all the memory cells M00, M01, . . . . That is,

PG=$V_{CC}$
ER=GND
$V_{PX}=V_{PY}=V_{PP}$

Also, data "0" is supplied to the write amplifier 6. In this state, an address defined by the internal address signals ADD2 is sequentially incremented. As a result, the threshold voltages of all the memory cells are made high.

Next, at step 602, a flash erasing operation is performed upon all the memory cells M00, M01, . . . . That is,

PG=GND
ER=$V_{CC}$
$V_{PX}=V_{PY}$=GND

As a result, the high power supply voltage $V_{PP}$ is applied to all the sources of the memory cells M00, M01, . . . , while all the word lines WL0, WL1, . . . are grounded. Thus, the threshold voltages of all the memory cells are made low.

Next, at step 603, an erasing verification operation is performed upon all the memory cells to determine whether or not the threshold voltages of the memory cells are lower than an upper limit value VU which is a slightly higher than a read voltage $V_R$, for example, 2.5V. That is,

PG=GND
EG=GND
$V_{PX}$=VU
$V_{PY}=V_{CC}$

In this state, an address defined by the internal address signals ADD2 is sequentially incremented, and it is determined whether or not read data from the sense amplifier 8 is "1", thus carrying out an erasing verification operation. Only if all the read data is "1", does the control proceeds to step 604, thus completing the routine of FIG. 6. Otherwise, the control at step 603 proceeds to step 605.

At step 605, the content CNT of the nonvolatile counter 10 is incremented by +1. Then, at step 606, it is determined whether or not the content CNT of the nonvolatile counter 10 is larger than a maximum value MAX. Only if CNT≤MAX, the control at steps 602 and 603 is repeated. Otherwise, the control proceeds to step 607, thus completing the routine of FIG. 6.

In FIG. 7, which shows a writing operation of the control circuit 9 of FIG. 5, steps 701 and 702 are added to the steps of FIG. 2.

First, at step 701, it is determined whether or not the content CNT of the nonvolatile counter 10 has reached a predetermined value CNT0. As a result, if CNT≤CNT0, the control proceeds to step 201. On the other hand, if CNT>CNT0, the control proceeds to step 702.

At step 201, a writing operation upon the memory cell such as M00 is carried out for the time period T1. Conversely, at step 702, a writing operation upon the memory cell such as M00 is carried out for a time period T2 which satisfies the following:

T1<T2<2·T1

Also, if the writing verification operation at step 202 fails, the control proceeds to step 201 in the same way as in FIG. 2.

As shown in FIG. 8A, if the number of writing verification operations is one, the time period of the writing operation upon the memory cell M00 is $$T1+T0 \tag{3}$$

This time period is the same as that of FIG. 3A (see the equation (1)).

On the other hand, as shown in FIG. 8B, if the number of writing verification operations is two, the time of the writing operation upon the memory cell M00 is $$T2+T0 \tag{4}$$

This time period is smaller than that of FIG. 3B (see the equation (2)) which is again shown in FIG. 8C. For example, (T2+T0)/(T1+T0)≈1.3

Note that, if the value CNT0 is appropriate, the number of writing verification operations is seldom three or more.

Thus, according to the writing operation routine of FIG. 7, even when the deterioration of the memory cells is advanced, an increase of the writing time period is small, so that an overwriting operation can be avoided. This suppresses the deterioration of the memory cells. Further, the writing time period is eventually decreased.

Figure 9:
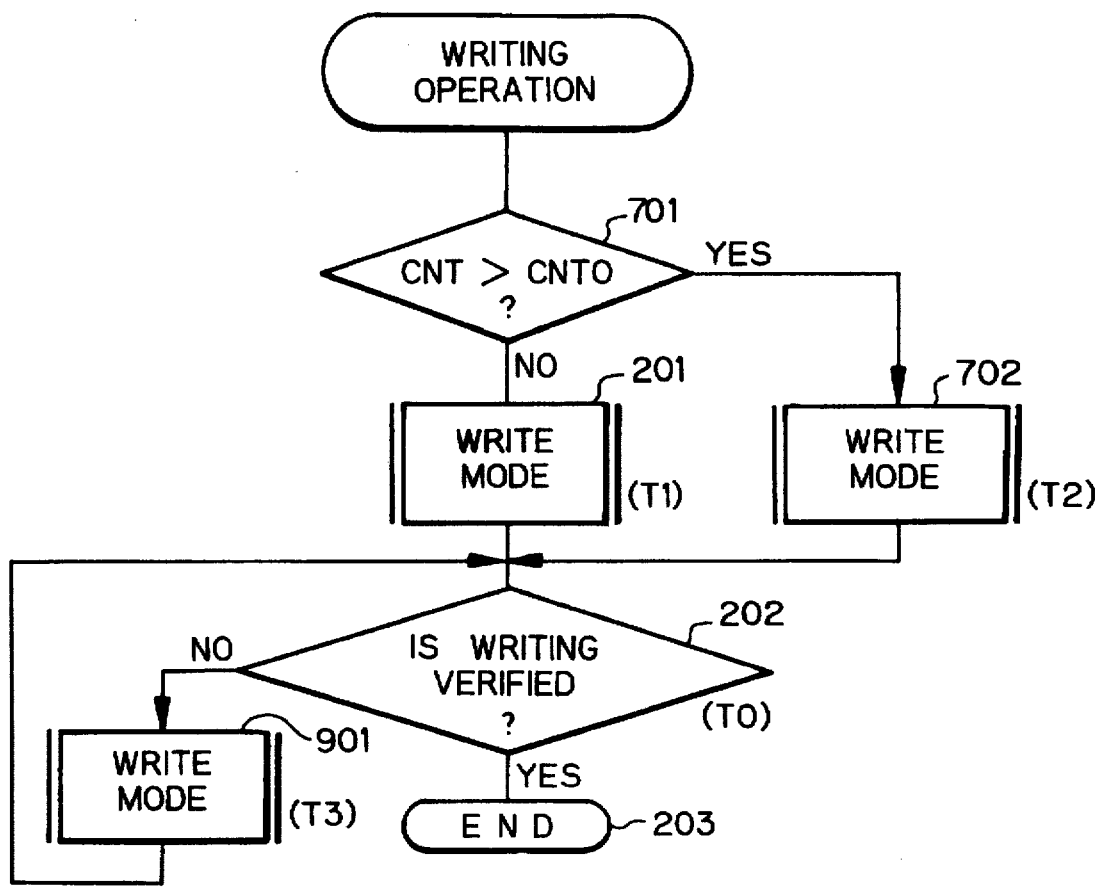

In FIG. 9, which is a modification of the routine of FIG. 7, a step 901 is added to the steps of FIG. 7. That is, if the writing verification operation fails at step 202, the control proceeds to step 901 which performs a writing operation upon the memory cell such as M00 for a time period T3 which satisfies the following:

$$T3<T1$$

Then, the control returns to step 202.

Figure 10A:
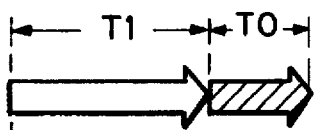

As shown in FIG. 10A, if the number of writing verification operations is one, a time period of the writing operation upon the memory cell M00 is $$T1+T0 \quad (5)$$

This time period is the same as that of FIG. 3A (see the equation (1)).

Figure 10B:
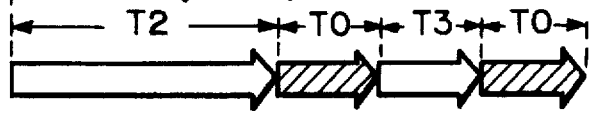

On the other hand, as shown in FIG. 10B, the number of writing verification operations is two, a time of the writing operation upon the memory cell M00 is $$T2+T0+T3+T0 \quad (6)$$

Figure 10C:
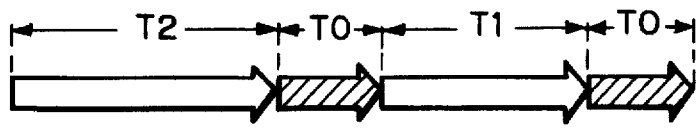

This time period is smaller than that of FIG. 10C which is obtained by carrying out the routine of FIG. 7.

Thus, according to the writing operation routine of FIG. 9, even when the deterioration of the memory cells is advanced, so that two writing operations are carried out on the memory cells, an increase in the writing time period is small, so that an overwriting operation can be avoided. This further suppresses the deterioration of the memory cells. In addition, the writing time period is eventually decreased.

Figure 11:
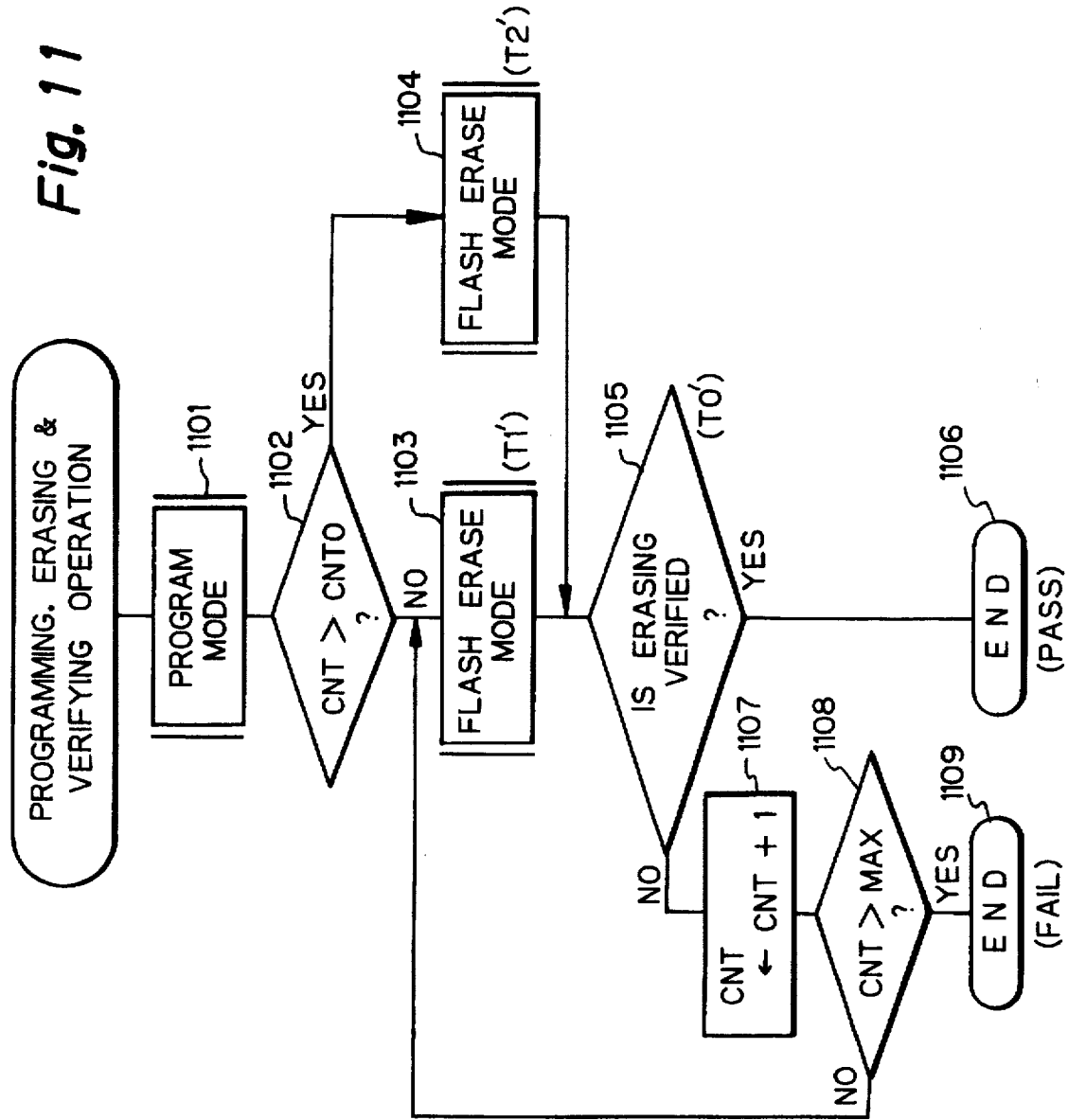

The control as shown in FIG. 7 is applied to a flash erase operation as shown in FIG. 11, which is also a routine carried out by the control circuit 9. Note that the content CNT of the nonvolatile counter 10 is cleared before shipping.

First, at step 1101, a programming or writing operation for avoiding an over-erasing operation is performed upon all the memory cells M00, M01, . . . . That is,

PG=$V_{CC}$
ER=GND
$V_{PX}=V_{PY}=V_{PP}$

Also, data "0" is supplied to the write amplifier 6. In this state, an address defined by the internal address signals ADD2 is sequentially incremented. As a result, the threshold voltages of all the memory cells are made high.

Next, at step 1102, it is determined whether or not the content CNT of the nonvolatile counter 10 has reached a predetermined value CNT0. As a result, if CNT≦CNT0, the control proceeds to step 1103 On the other hand, if CNT>CNT0, the control proceeds to step 1104.

At step 1103, a flash erasing operation upon all the memory cells is carried out for a time period T1'. However, at step 1104, a flash erasing operation upon all the memory cells is carried out for a time period T2' which satisfies the following:

$$T1'<T2'<2\cdot T1'$$

Note that the flash erasing operation at steps 1103 and 1104 is carried out on the following conditions:

PG=GND
ER=$V_{CC}$
$V_{PX}=V_{PY}$=GND

As a result, the high power supply voltage $V_{PP}$ is applied to all the sources of the memory cells M00, M01, . . . , while all the word lines WL0, WL1, . . . are grounded. Thus, the threshold voltages of all the memory cells are made low.

Next, at step 1105, an erasing verification operation is performed upon all the memory cells to determine whether or not the threshold voltages of the memory cells are lower than the upper limit value VU. That is,

PG=GND
EG=GND
$V_{PX}$=VU
$V_{PY}V_{CC}$

In this state, an address defined by the internal address signals ADD2 is sequentially incremented, and it is determined whether or not read data from the sense amplifier 8 is "1", thus carrying out an erasing verification operation. Only if all the read data is "1", does the control proceeds to step 1106, thus completing the routine of FIG. 11. Otherwise, the control at step 1105 proceeds to step 1107. Here, it is assumed that such an erasing verification operation is carried out for a time period T0'.

At step 1107, the content CNT of the nonvolatile counter 10 is incremented by +1. Then, at step 1108, it is determined whether or not the content CNT of the nonvolatile counter 10 is larger than a maximum value MAX. Only if CNT≦MAX, the control at steps 1103 and 1105 is repeated. Otherwise, the control proceeds to step 1109, thus completing the routine of FIG. 11.

Figure 12:
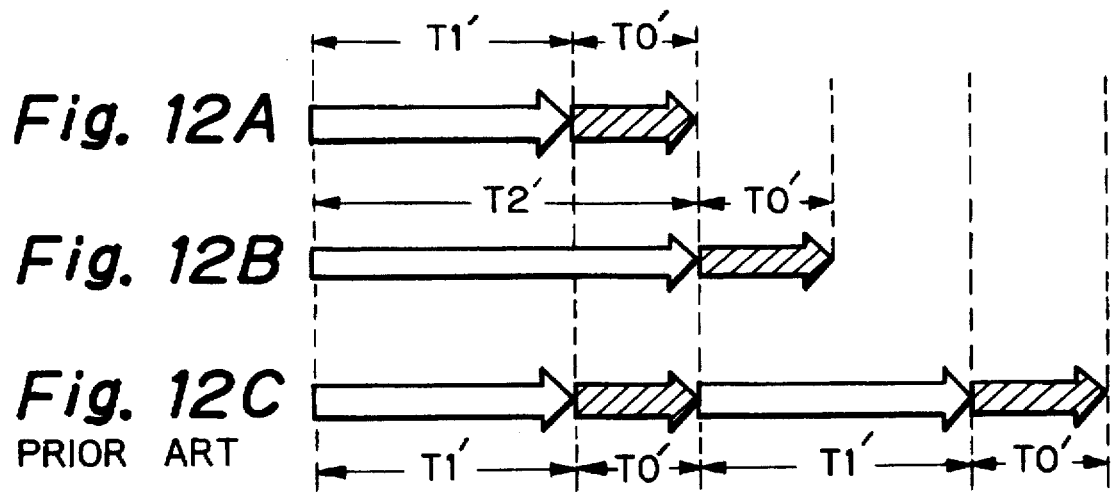

As shown in FIG. 12A, if the number of erasing verification operations is one, the time period of the flash erasing operation is $$T1'+T0' \quad (7)$$

This time period is the same as in the prior art.

On the other hand, as shown in FIG. 12B, if the number of writing verification operations is two, the time period of the flash erasing operation is $$T2'+T0' \quad (8)$$

This time period is smaller than that of the prior art as shown in FIG. 12C. For example, $$(T2'+T0')/(T1'+T0')\approx 1.3$$

Note that, if the value CNT0 is appropriate, the number of erasing verification operations is seldom three or more.

Thus, according to the flash erasing operation routine of FIG. 11, even when the deterioration of the memory cells is advanced, an increase in the flash erasing time is small, so that an overerasing operation can be avoided. This suppresses the deterioration of the memory cells. Further, the erasing time period is eventually decreased.

Figure 13:
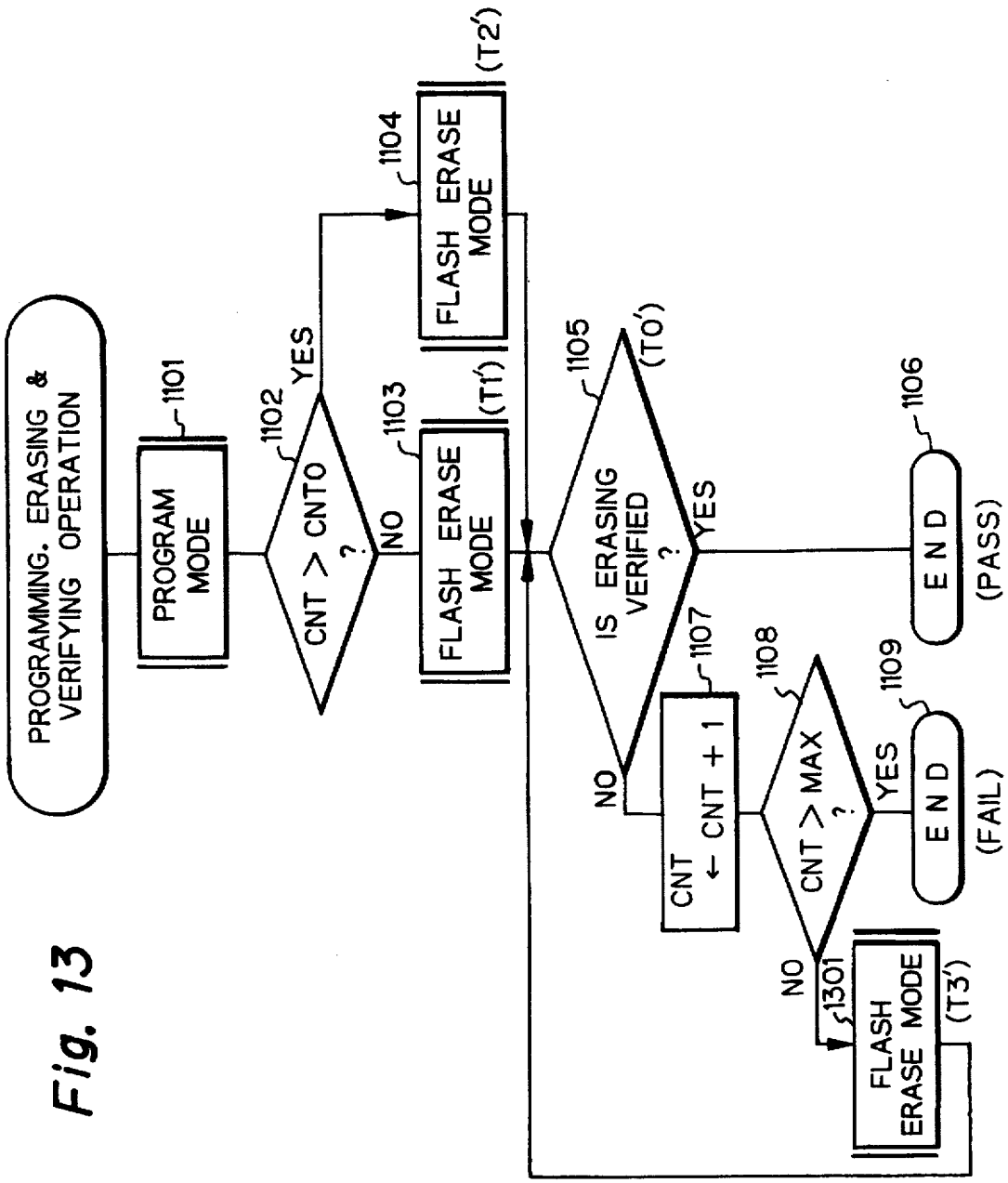

In FIG. 13, which is a modification of the routine of FIG. 11, a step 1301 is added to the steps of FIG. 11. That is, if the erasing verification operation fails at step 1105, the control proceeds to step 1301 which performs a flash erasing operation upon all the memory cells for a time period T3' which satisfies the following:

$$T3'<T1'$$

Then, the control returns to step 1105.

Figures 14A, 14B, 14C:
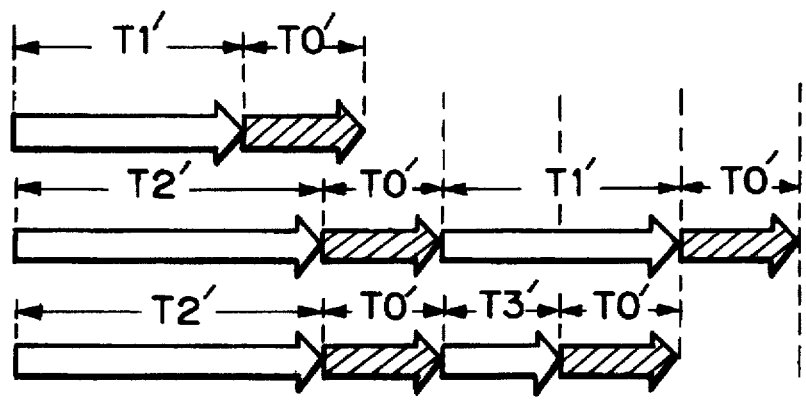

As shown in FIG. 14A, if the number of erasing verification operations is one, the time period of the erasing operation is $$T1'+T0' \quad (9)$$

This time period is the same as that of FIG. 12A (see the equation (7)).

On the other hand, as shown in FIG. 14B, if the number of erasing verification operations is two, the time period of the erasing operation is $$T2'+T0'+T3'T0' \quad (10)$$

This time period is smaller than that of FIG. 14C which is obtained by carrying out the routine of FIG. 11.

Thus, according to the erasing operation routine of FIG. 13, even when the deterioration of the memory cells is advanced, so that two erasing operations are carried out for the memory cells, an increase of the erasing time is small, so that an overerasing operation can be avoided. This further suppresses the deterioration of the memory cells. In addition, the erasing time period is eventually decreased.

The above-described embodiment is related to a flash type nonvolatile semiconductor memory device, however, the present invention can be applied to an ultraviolet erasable semiconductor memory device.

As explained hereinabove, according to the present invention, the deterioration of memory cells can be suppressed, and also, the writing time period and the erasing time period can be reduced.

I claim:

1. A nonvolatile semiconductor memory device, comprising:
   a nonvolatile counter for storing a number of erasing operations; and
   means for performing a writing operation upon a memory cell for a time period which is changed in accordance with the number of erasing operations stored in said nonvolatile counter.

2. A nonvolatile semiconductor memory device, comprising:
   a nonvolatile counter for storing a number of erasing operations;
   means for determining whether or not the number of erasing operations stored in said nonvolatile counter has reached a certain value;
   means for performing a first writing operation upon a memory cell for a first time period, before the number of erasing operations stored in said nonvolatile counter reaches said certain value; and
   means for performing a second writing operation upon said memory cell for a second time period, after the number of erasing operations stored in said nonvolatile counter has reached said certain value,
   said second time period being larger than said first time period.

3. The apparatus as set forth in claim 2, further comprising:
   means for performing a writing verification operation upon said memory cell to verify whether or not a threshold voltage of said memory cell is higher than a lower limit value, after one of said first and second writing operations is completed; and
   means for repeating said first writing operation and said writing verification operation, when the threshold voltage of said memory cell is not higher than said lower limit value.

4. The apparatus as set forth in claim 2, further comprising:
   means for performing a writing verification operation upon said memory cell to verify whether or not a threshold voltage of said memory cell is higher than a lower limit value, after one of said first and second writing operations is completed; and
   means for performing a third writing operation upon said memory cell for a third time period smaller than said first time period, when the threshold voltage of said memory cell is not higher than said lower limit value; and
   means for repeating said writing verification operation, after said third writing operation is completed.

5. A nonvolatile semiconductor memory device, comprising:
   a nonvolatile counter for storing a number of erasing operations; and
   means for performing an erasing operation upon memory cells for a time period which is changed in accordance with the number of erasing operations stored in said nonvolatile counter.

6. The device as set forth in claim 5, further comprising means for performing a programming operation upon said memory cells, before said erasing operation is performed upon said memory cells.

7. A nonvolatile semiconductor memory device, comprising:
   a nonvolatile counter for storing a number of erasing operations;
   means for determining whether or not the number of erasing operations stored in said nonvolatile counter has reached a certain value;
   means for performing a first erasing operation upon memory cells for a first time period, before the number of erasing operations stored in said nonvolatile counter reaches said certain value; and
   means for performing a second erasing operation upon said memory cells for a second time period, after the number of erasing operations stored in said nonvolatile counter has reached said certain value,
   said second time period being larger than said first time period.

8. The device as set forth in claim 7, further comprising means for performing a programming operation upon said memory cells, before said erasing operation is performed upon said memory cells.

9. The apparatus as set forth in claim 7, further comprising:
   means for performing an erasing verification operation upon said memory cells to verify whether or not threshold voltages of said memory cells are lower than an upper limit value, after one of said first and second erasing operations is completed; and
   means for repeating said first erasing operation and said erasing verification operation, when at least one of the threshold voltages of said memory cells is not lower than said upper limit value.

10. The apparatus as set forth in claim 7, further comprising:
    means for performing an erasing verification operation upon said memory cells to verify whether or not threshold voltages of said memory cells are higher than an upper limit value, after one of said first and second erasing operations is completed;
    means for performing a third erasing operation upon said memory cells for a third time period smaller than said first time period, when at least one of the threshold voltages of said memory cells is not lower than said upper limit value; and means for repeating said erasing verification operation, after said third erasing operation is completed.

* * * * *